(12) United States Patent
Tsenter et al.

(10) Patent No.: US 7,605,591 B2
(45) Date of Patent: Oct. 20, 2009

(54) STATE OF HEALTH RECOGNITION OF SECONDARY BATTERIES

(75) Inventors: Boris J. Tsenter, Roswell, GA (US); John E. James, Redlands, CA (US)

(73) Assignee: GEM Power, LLC, Redlands, CA (US)

( * ) Notice: Subject to any disclaimer, the term of this patent is extended or adjusted under 35 U.S.C. 154(b) by 386 days.

(21) Appl. No.: 11/277,732

(22) Filed: Mar. 28, 2006

(65) Prior Publication Data

US 2007/0236225 A1    Oct. 11, 2007

(51) Int. Cl.
*G01N 27/416*    (2006.01)

(52) U.S. Cl. .................. 324/432; 324/426; 324/429; 320/132

(58) Field of Classification Search .............. 324/426, 324/427, 429, 430, 434; 320/132; 706/63, 706/65
See application file for complete search history.

(56) References Cited

U.S. PATENT DOCUMENTS

2006/0284617 A1\* 12/2006 Kozlowski et al. .......... 324/426

\* cited by examiner

*Primary Examiner*—Edward Tso
*Assistant Examiner*—Ramy Ramadan
(74) *Attorney, Agent, or Firm*—Patent Venture Group; Joe A. Brock, II (57) ABSTRACT

An invention is provided for determining a state of health of a battery. The invention includes applying a predefined load profile to a battery, and obtaining a plurality of battery response voltage data corresponding to points along the predefined load profile. A matrix of parameters, which includes, among other data, battery ohm resistance data, battery chemical resistance data, and battery electrical double layer capacity data, is calculated from the battery response voltage data. Thereafter, the matrix of parameters is utilized to determine the state of health of the battery.

17 Claims, 12 Drawing Sheets

Matrix of Parameters

| Parameter | Charging Mode | | Diagnostic Mode | | Charging Mode | |
|---|---|---|---|---|---|---|
| $R_{0ohm}$ | 0.0024 | 0.0024 | 0.0023 | 0.0024 | 0.0025 | 0.0024 |
| $R_{0ch}$ | 0.0002 | 0.0002 | 0.0003 | N/A | 0.0002 | 0.0003 |
| $C_0$ | 0.0024 | N/A | 0.0023 | N/A | 0.0025 | N/A |
| $E_i$ | 0.23 | N/A | N/A | N/A | 0.25 | N/A |
| $E_{un}$ | 0.2 | N/A | N/A | N/A | 0.25 | N/A |

STATE OF HEALTH RECOGNITION OF SECONDARY BATTERIES

STATEMENT REGARDING FEDERALLY SPONSORED RESEARCH OR DEVELOPMENT

Development of the present invention was funded under Navy contracts N00421-03-C-0063 and N00014-04-C-0380 and is a "subject invention" thereunder.

CROSS REFERENCE TO RELATED APPLICATIONS

This application is related to U.S. patent application having Ser. No. 11/101,049, filed on Apr. 6, 2005, entitled "Intelligent Battery Charging System," which is hereby incorporated by reference.

BACKGROUND OF THE INVENTION

1. Field of the Invention

This invention relates generally to battery monitoring systems and, more particularly, to real-time battery State of Health detection utilizing a Matrix of battery Parameters.

2. Description of the Related Art

State of health recognition for a rechargeable battery is an important element of the total battery management in order to ensure proper operation of electrical systems operated by the battery. State of health can be considered as current state of charge, useful remaining life as a function of life cycle, and useful remaining discharge time as a function of the current discharge rate.

Prior art techniques for discovering battery state of health generally only analyze current and voltage behavior by examining a battery utilizing an electronics approach. That is, prior art approaches examine the battery as though the battery were a transistor, and use a transistor analysis to categorize the battery. By way of example, U.S. Pat. No. 6,956,355 describes a self-diagnosis system for an energy storage device, the latter including a plurality of electrochemical cells connected in series or parallel to form a cell string. The self-diagnosis system correlates a state of health of the battery based on the internal resistance value of each electrochemical cell of the energy storage device and determines a corresponding battery initial capacity which enables the self-diagnosis system to evaluate the exact capacity of the battery at any given time.

Unfortunately, batteries operate under much more complicated physical conditions than electronic devices. For example, physical conditions for batteries include simultaneously charge, mass and heat unstationary transfer in three phase environments, which are much more complicated than the operating condition of single solid state electronic devices. In view of the foregoing, there is a need for systems and methods for real-time battery State of Health detection. In particular, the systems and methods should examine intrinsic battery parameters to determine the battery's state of health.

SUMMARY OF THE INVENTION

Broadly speaking, embodiments of the present invention examine significant chemical and physical parameters of a battery to determine the battery's state of health. Through utilization of a matrix of parameters, which includes data on the battery's solid phase, liquid phase, and gas phase, embodiments of the present invention are capable of accurately portraying a battery. In one embodiment, a method for determining a state of health of a battery is disclosed. The method includes applying a predefined load profile to a battery and obtaining a plurality of battery response voltage data corresponding to points along the predefined load profile. A matrix of parameters, which includes, among other data, battery ohm resistance data, battery chemical resistance data, and battery electrical double layer capacity data, is calculated from the battery response voltage data. Thereafter, the matrix of parameters is utilized to determine the state of health of the battery. The state of health of the battery generally state of charge of the battery, battery useful remaining life as a function of life cycle, and battery useful remaining discharge time as a function of current discharge rate.

An additional method for determining a state of health of a battery is disclosed in a further embodiment of the present invention. The method includes generating a state of charge profile for a battery that indicates matrix of parameter data values corresponding to a plurality of battery state of charge percentages. The method continues by calculating a current matrix of parameters for the battery from the current battery response voltage data. As above, the current matrix of parameters includes, among other data, battery ohm resistance data, battery chemical resistance data, and battery electrical double layer capacity data. The current matrix of parameters is compared to the state of charge profile to determine the current battery state of charge of the battery. The total state of health of the battery can then be determined based on the current battery state of charge. In this aspect, the useful remaining discharge time as a function of current discharge rate can be determined utilizing the current battery state of charge. In addition, the useful remaining life of the battery as a function of life cycle can be determined utilizing the current matrix of parameters. That is, as will be described in greater detail subsequently, an end to the useful remaining life of the battery can be predicted when a sharp rise occurs in the battery chemical resistance while the battery state of charge is about 0%, and/or when a sharp rise occurs in the battery electrical double layer capacity while the battery state of charge is about 100%.

A system for determining a state of health of a battery is disclosed in yet a further embodiment of the present invention. The system includes a switching circuit, which is coupled to a power source and a battery load. The switching circuit is capable of applying a predefined load profile to a battery. Coupled to the switching circuit is a battery management module. The battery management module includes logic that obtains a plurality of battery response voltage data corresponding to points along the predefined load profile. The battery management module also includes logic that calculates a matrix of parameters from the battery response voltage data. As above, the matrix of parameters includes battery ohm resistance data, battery chemical resistance data, and battery electrical double layer capacity data, among other data. In addition, the battery management module includes logic that determines from the matrix of parameters the state of health of the battery. Similar to above, the battery management module can further include logic that generates a state of charge profile for the battery which indicates matrix of parameter data values corresponding to a plurality of battery state of charge percentages. In this case, logic can be included that compares the matrix of parameters to the state of charge profile to determine the current battery state of charge. Utilizing the current battery state of charge, the battery management module can determine the useful remaining discharge time as a function of current discharge rate. In addition, the battery management module can be configured to determine useful remaining life of the battery as a function of life cycle utilizing the matrix of parameters.

That is, when a sharp rise occurs in the battery chemical resistance while the battery state of charge is about 0%, and/or when a sharp rise occurs in the battery electrical double layer capacity while the battery state of charge is about 100%, the battery management module can predict imminent battery failure. Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings in which.

DETAILED DESCRIPTION OF THE PREFERRED EMBODIMENTS

An invention is disclosed for battery state of health recognition. Embodiments of the present invention examine multiply battery parameters to determine the battery's state of health. Through utilization of a matrix of parameters, embodiments of the present invention are capable of accurately portraying a battery. As a result, embodiments of the present invention can accurately determine a battery's state of health, which comprises state of charge, useful remaining battery life as a function of battery life cycle, and useful remaining battery discharge time as a function of the current battery discharge rate, regardless of the current discharging or cycling mode the battery is in. Advantageously, embodiments of the present invention can be utilized during charging of a battery, during separate analysis of the battery, or during any other time battery state of health information is needed.

In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Broadly speaking, to determine a battery's state of health, embodiments of the present invention apply a predefined load profile to a battery and obtain battery response voltage data that corresponds to points along the predefined load profile. The battery response voltage data is utilized thereafter to calculate a matrix of parameters, which includes battery data on the most significant battery chemical and physical parameters, such as the battery ohm resistance, chemical resistance, and electrical double layer capacity. From the matrix of parameters, embodiments of the present invention determine the state of health of the battery, including the battery state of charge, useful remaining battery life as a function of battery life cycle, and useful remaining battery discharge time as a function of the current battery discharge rate.

As mentioned above, embodiments of the present invention can be utilized during storage, charging or discharging of a battery, during separate analysis of the battery, or during any other time battery state of health information is needed. For exemplary purposes, embodiments of the present invention will now be described as utilized during the process of charging a battery. However, it should be noted that the embodiments of the present invention are not limited to battery charging, and can be utilized any time battery state of health information is needed as described above.

Figure 1:
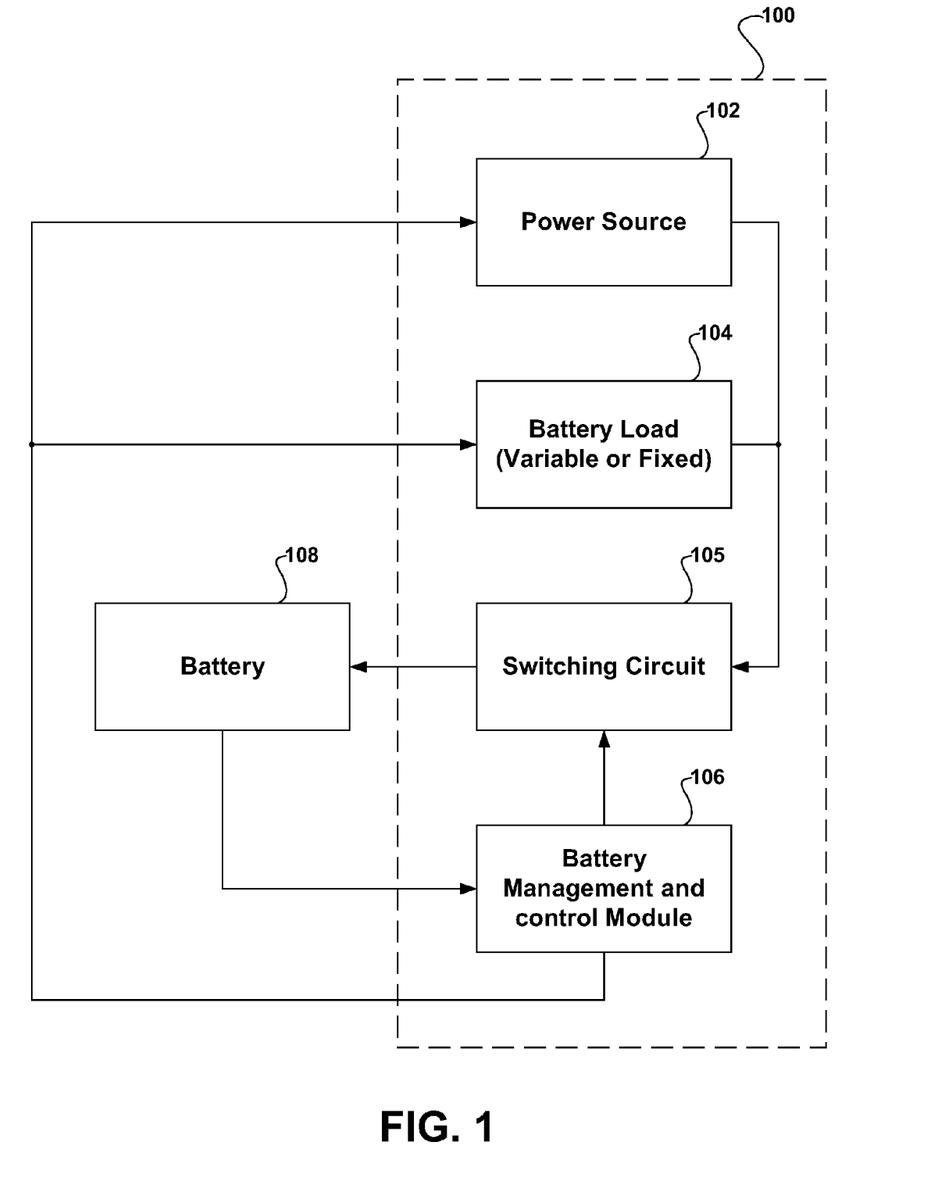
FIG. 1 is a block diagram of a battery charging and discharging circuit capable of battery state of health recognition in accordance with an embodiment of the present invention.

FIG. 1 is a block diagram of a battery charging and discharging circuit 100 capable of battery state of health recognition in accordance with an embodiment of the present invention. The battery charging and discharging circuit 100 of the embodiments of the present invention comprises a power source 102, a variable or fixed battery load 104, a switching circuit 105, and a dynamic programmed logic battery management module 106 having timing and control with a Program Interrupt Controller (PIC), and/or a microcontroller and/or microprocessor and associated circuitry. The power source 102 is connected to the switching circuit 105 and the battery load 104, which may be for example, a variable load bank. The output of the switching circuit 105 is connected to the battery 108 to be charged, and the output of the battery 108 is connected to the battery management module 106, which in turn, is connected to the switching circuit 105.

As will be described in greater detail below, the battery management module 106 includes logic that obtains a plurality of battery response voltage readings resulting from a predefined load profile applied to the battery 108 via the switching circuit 105. The battery management module 106 also calculates a matrix of parameters based on the battery response voltage readings. The battery management module 106 then utilizes the matrix of parameters to determine the state of health of the battery. The logical steps performed by the battery management module 106 will be described subsequently, beginning with an overview of an exemplary method for performing battery diagnostic operations to determine the battery's state of health illustrated in FIG. 2.

Figure 2:
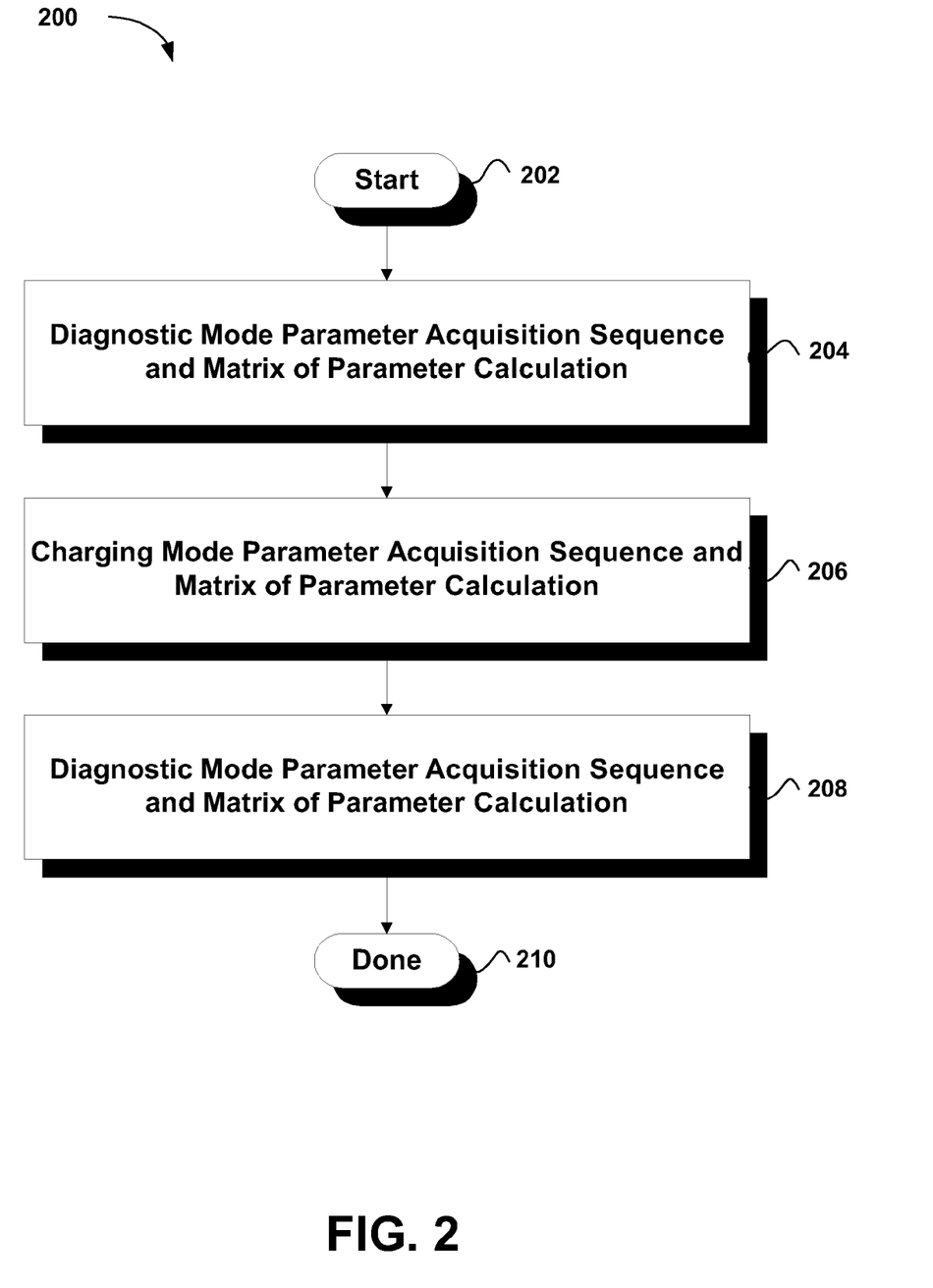
FIG. 2 is flowchart showing a method for performing battery diagnostic operations to determine the battery's state of health.

As mentioned above, embodiments of the present invention utilize a matrix of parameters that includes data on a battery life cycle to determine the battery state of health. FIG. 2 is flowchart showing a method 200 for performing battery diagnostic operations to determine the battery's state of health.

In initial operation 202, preprocess operations are performed. Preprocess operations can include, for example, checking for the presence of a battery to be analyzed, checking battery chemistry, rated capacity or number of cells in a battery string, and other preprocess operations that will be apparent to those skilled in the art after a careful reading of the present disclosure.

In operation 204, a diagnostic mode parameter acquisition sequence is performed and the resulting data is utilized to calculate matrix of parameter data. As mentioned above, embodiments of the present invention determine the state of health of a battery using a matrix of battery parameters. In operation 204, matrix of parameter data is acquired utilizing a diagnostic mode predefined load profile, as described in greater detail below with reference to FIG. 3 and FIG. 5.

In operation 206, a charging mode parameter acquisition sequence is performed and the resulting data is utilized to calculate matrix of parameter data. In this case, matrix of parameters data is acquired utilizing a charging mode predefined load profile, as described in greater detail below with reference to FIG. 3 and FIG. 4. And in operation 208, another diagnostic mode parameter acquisition sequence is performed and the resulting data is utilized to calculate matrix of parameter data. Similar to operation 204, in operation 208, matrix of parameter data is again acquired utilizing a diagnostic mode predefined load profile. Post process operations are performed in operation 210, which can include charging the battery, signaling the battery is fully charged, signaling the battery is not fully charge, and other post process operations that will be apparent to those skilled in the art after a careful reading of the present disclosure. To acquire data for the matrix of parameters and determine battery state of health, embodiments of the present invention utilize relationships between battery response voltages, as described in greater detail next.

Figure 3:
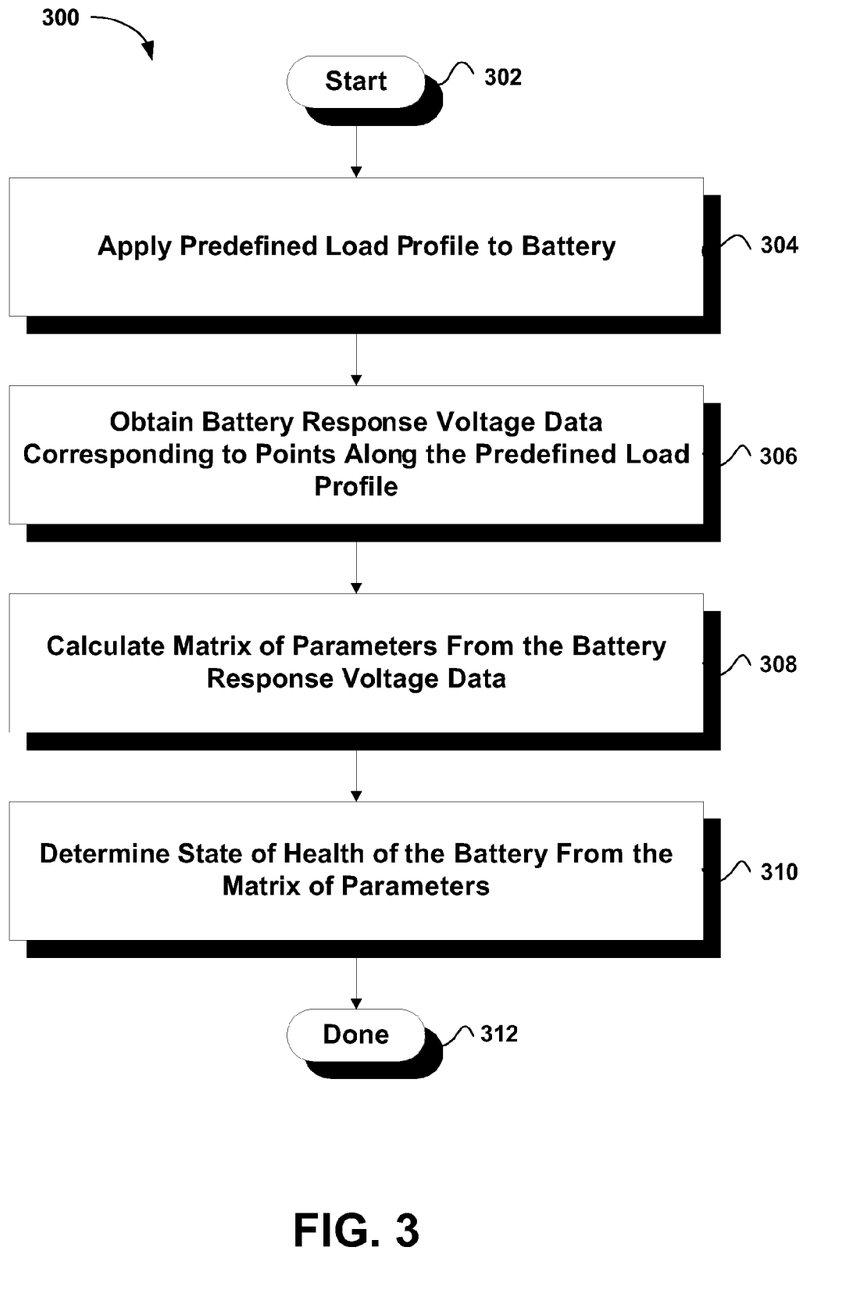
FIG. 3 is a flowchart showing method for determining a state of health of a battery in accordance with an embodiment of the present invention.

FIG. 3 is a flowchart showing method 300 for determining a state of health of a battery in accordance with an embodiment of the present invention. In an initial operation 302, preprocess operations are performed. Preprocess operations can include, for example, connecting the battery to an electronics device for use, connecting a battery to an analysis or charging apparatus, and other preprocess operations that will be apparent to those skilled in the art after a careful reading of the present disclosure.

In operation 304, a predefined load profile is applied to the battery. Broadly speaking, embodiments of the present invention determine the state of health of a battery using a matrix of parameters, as will be described in greater detail below. One manner in which embodiments of the present invention obtain data for the matrix of parameters is through a parameter acquisition sequence and voltage analysis of the battery. Thus, in operation 304, a predefined load profile is applied to the battery. Embodiments of the present invention can utilize any current profile having a pulse, depolarization, and rest spans to obtain these parameters. For example, in one embodiment, the predefined load profile utilized depends on whether a diagnostic mode data acquisition sequence is being utilized or whether a charging mode data acquisition sequence is being utilized.

Figure 4:
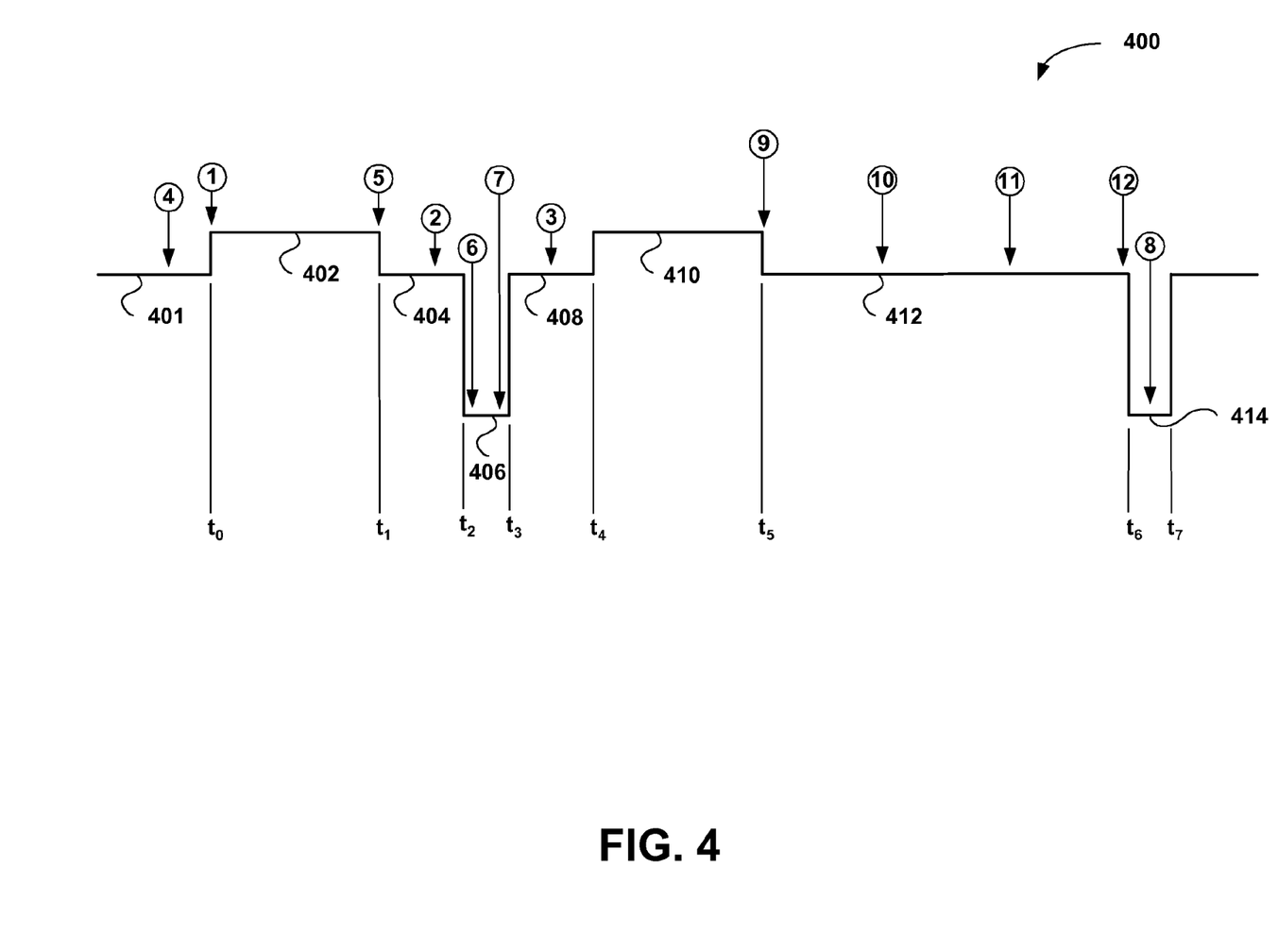
FIG. 4 is an illustration of an exemplary predefined load profile utilized during charging mode parameter acquisition, in accordance with an embodiment of the present invention.

For example, FIG. 4 is an illustration of an exemplary predefined load profile 400 utilized during charging mode parameter acquisition, in accordance with an embodiment of the present invention. As noted above, it should be borne in mind that the embodiments of the present invention can utilize any current profile having a pulse, depolarization, and rest spans to obtain data for the matrix of parameters. For example, in FIG. 4 the exemplary predefined load profile 400 includes an initial rest period 401 followed by an initial charging pulse 402, a ten millisecond rest period 404, a depolarizing pulse 406, a 10 millisecond rest period 408, a charging pulse 410, a five hundred millisecond rest period 412, and a depolarizing pulse 414, all over a period of 2.5 seconds.

Figure 5:
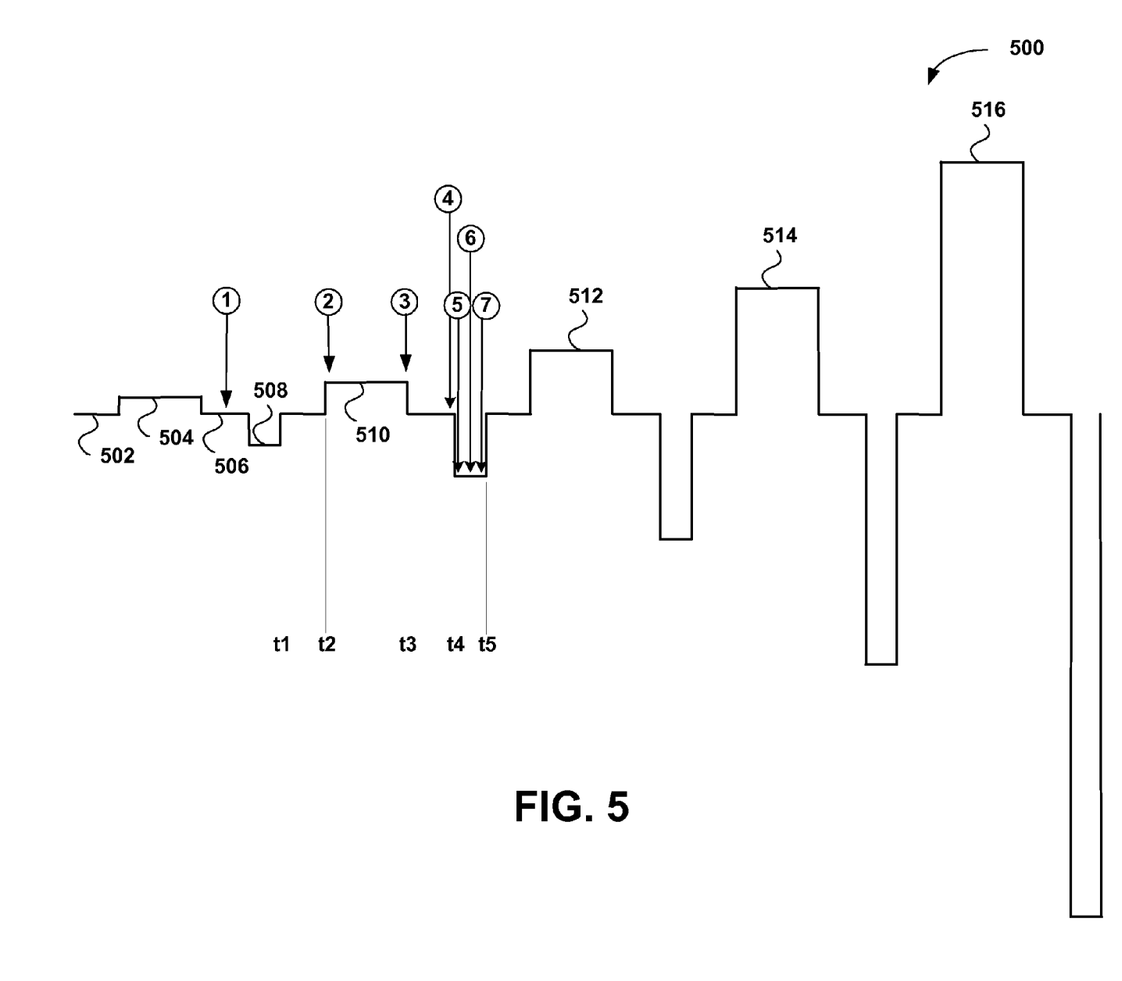
FIG. 5 is an illustration of an exemplary predefined load profile utilized during diagnostic mode parameter acquisition, in accordance with an embodiment of the present invention.

As further example of a predefined load profile suitable for use with the embodiments of the present invention, FIG. 5 is an illustration of an exemplary predefined load profile 500 utilized during diagnostic mode parameter acquisition, in accordance with an embodiment of the present invention. As noted above, it should be borne in mind that the embodiments of the present invention can utilize any current profile having a pulse, depolarization, and rest spans to obtain data for the matrix of parameters. For example, in FIG. 5 the exemplary predefined load profile 500 includes an initial ten millisecond rest period 502 followed by an initial one thousand millisecond charging pulse 504, a ten millisecond rest period 506, and a ten millisecond depolarizing pulse 508. The sequence is thereafter repeated with the exception of that the amplitudes of the charge pulse and depolarizing pulse increase with each iteration. For example, the amplitude of charge pulse 504 is one quarter the amplitude of charge pulse 512, and the amplitude of charge pulse 510 is one half the amplitude of charge pulse 512. Similarly, the amplitude of charge pulse 514 is twice the amplitude of charge pulse 512, and the amplitude of charge pulse 516 is quadruple the amplitude of charge pulse 512.

Referring back to FIG. 3, battery response voltage data corresponding to points along the predefined load profile is obtained, in operation 306. Turning back to FIG. 4, the battery response voltage corresponding to various data points (1-12 in FIG. 4) along the predefined load profile 400 are measured. Similarly, during diagnostic mode parameter acquisition, the battery response voltage corresponding to various data points (1-7 in FIG. 5) along the predefined load profile 500 are measured. The battery response voltage corresponding to a data point is referred to as a "channel." Hence, FIG. 4 depicts twelve (12) channels along the predefined load profile 400, and FIG. 5 depicts seven (7) channels along the predefined load profile 500. The battery response voltage readings are collected by the battery management and control module 106 at designated intervals and analyzed, and repeated.

Figure 6:
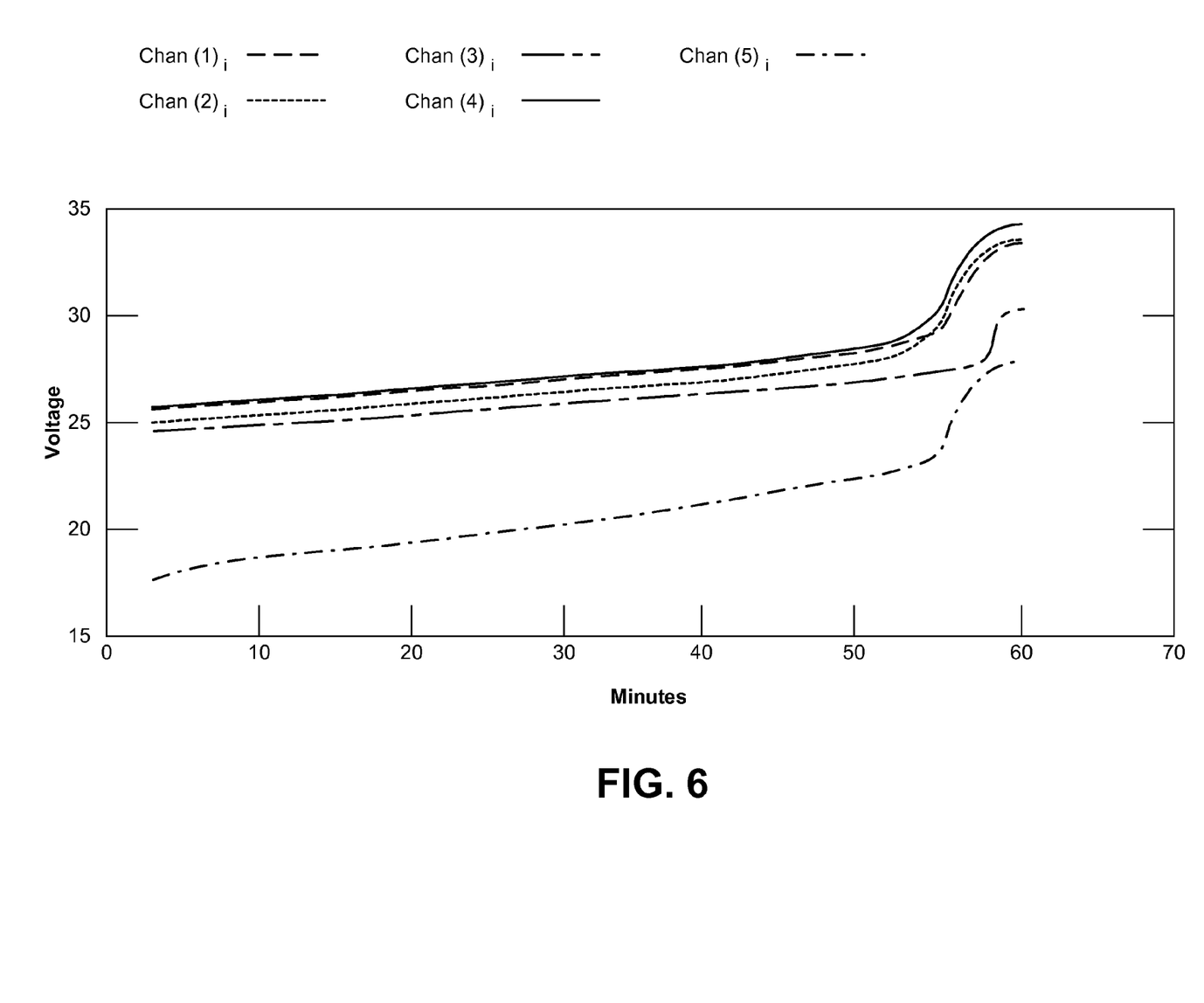
FIG. 6 illustrates typical charge data taken over eighteen hundred sequences for a few of the channels of the charge mode predefined load profile of FIG. 5.

By way of example, FIG. 6 illustrates typical charge data taken over eighteen hundred sequences for a few of the channels of the charge mode predefined load profile of FIG. 4. Each channel 1-5 curve of FIG. 6 illustrates the battery response voltage readings corresponding to the point on the predefined load profile 400 of FIG. 4 having the same number designation as the channel. For example, the measured voltage across the battery 108 after imposition of the charging pulse 402, which corresponds to point 2, is referred to as channel (2), and the measured voltage across the battery 108 after imposition of the depolarizing pulse 406, which corresponds to point 3, is referred to as channel (3). Similarly, the measured voltage across the battery 108 at the beginning of the charge pulse 402, which corresponds to point 1, is referred to as channel (1), and the measured voltage across the battery 108 at the end of the charge pulse 402, which corresponds to point 5, is referred to as channel (5).

Turning back to FIG. 3, matrix of parameter data is calculated from the battery response voltages data, in operation 308. As mentioned above, embodiments of the present invention apply a predefined load profile, such as the charging mode profile (FIG. 4) or diagnostic mode profile (FIG. 5), and examine the battery response voltages at the various times indicated by the channels. For example, in FIG. 4, channels 1 (Ch1) and 5 (Ch5) record charging voltage battery response voltage data at the beginning and end of charging pulse 402. Channel 2 (Ch2) records the battery open circuit voltage (OCV) immediately after current interruption (also referred to as the instantaneous open circuit voltage $E_i$). Channels 6 (Ch6) and 7 (Ch7) produce voltage values at the beginning (Ch6) and in the end (Ch7) of the depolarization pulse (DP) 406. Channel 3 records the battery response voltage at the end of the rest period 408 after DP, and channel 12 (Ch12) records the battery OCV after a predefined rest length 412 (also referred to as the unstationary open circuit voltage $E_{un}$). In one embodiment, $E_{un}$ is sampled after a rest length 412 in the range of about 150-500 ms.

The matrix of parameters includes battery data such as the battery ohm resistance, chemical resistance, and electrical double layer capacity. To obtain these parameters, embodiments of the present invention can utilize any current profile having a pulse, depolarization, and rest spans. Specific ohm resistance can be measured by sampling the battery response voltage difference between the very end of charging and the very beginning of rest and referring this difference to charging current and battery rated capacity. The time interval for sampling the battery response voltage difference can be in the range of about 1-20 ms. Specific ohm resistance can also be measured in discharging mode as the battery response voltage difference between the open circuit voltage and the discharging pulse. As above, the time interval for sampling can be in the range of about 1-20 ms. Specific ohm resistance can be further determined utilizing the depolarization pulse. Here, specific ohm resistance is obtained from the battery response voltage difference between the voltage prior to depolarization and after 1-20 ms of the beginning of the depolarization pulse referred to depolarization current and battery rated capacity.

For example, using the above described charging mode profile 400 and diagnostic mode profile 500, embodiments of the present invention can calculate the battery specific ohm resistance ($R_{0ohm}$) in two different manners utilizing the charging mode profile and in two different manners utilizing the diagnostic mode profile. It should be noted that the below described equations should be considered as illustrative and not restrictive. Hence, any means can be utilized to obtain the specific ohm resistance data within the scope and equivalents of the appended claims. For example, the battery specific ohm resistance can be calculated using a ratio of voltage drop after charge interruption and the amplitude of charging pulse (CP) or depolarizing pulse (DP) is utilized, indicated by the following equations 1-4:

Charging mode (FIG. 5):

$$R_{0ohm}=(Ch5-Ch2)\times Qr/(N\times CP) \quad (1)$$

$$R_{0ohm}=(Ch2-Ch6)\times Qr/(N\times DP) \quad (2)$$

Diagnostic mode (FIG. 6):

$$R_{0ohm}=(Ch3-Ch4)\times Qr/(N\times CP) \quad (3)$$

$$R_{0ohm}=(Ch4-Ch5)\times Qr/(N\times DP), \quad (4)$$

where N is the number of cells in the battery and Qr is the battery rated capacity.

Specific chemical resistance can be sampled as the difference between the instantaneous and unstationary open circuit voltage referred to the charging current and battery rated capacity. The time span for this difference can be in the range of about 20 ms-4000 s. Specific chemical resistance can also be obtained from the battery response voltage difference at the end of the charging pulse and the beginning of the charging pulse referred to charging current and battery rated capacity. The time interval can be in the range of about 100 ms-2000 s.

For example, using the above described charging mode profile 400 and diagnostic mode profile 500, embodiments of the present invention can calculate specific chemical resistance ($R_{0Ch}$) is calculated in two different manners utilizing the charging mode profile and in one approach utilizing the diagnostic mode profile. It should be noted that the below described equations should be considered as illustrative and not restrictive. Hence, any means can be utilized to obtain the specific chemical resistance data within the scope and equivalents of the appended claims. For example, specific chemical resistance ($R_{0Ch}$) can be calculated as indicated by the following equations 5-7:

Charging mode (FIG. 5):

$$R_{0Ch}=(Ch2-Ch3)\times Qr/(N\times CP) \quad (5)$$

$$R_{0Ch}=(Ch1-Ch5)\times Qr/(N\times CP) \quad (6)$$

Diagnostic mode (FIG. 6):

$$R_{0Ch}=(Ch2-Ch3)\times Qr/(N\times CP) \quad (7)$$

Specific electrical double layer capacity ($C_0$) can be measured as the product of the depolarization current and the time interval equal to 1-10 ms referred to the voltage difference for the same time interval. For example, using the above described charging mode profile 400 and diagnostic mode profile 500, embodiments of the present invention can calculate the battery specific electrical double layer capacity ($C_0$) in both charging mode and diagnostic mode. It should be noted that the below described equations should be considered as illustrative and not restrictive. Hence, any means can be utilized to obtain the specific electrical double layer capacity data within the scope and equivalents of the appended claims. For example, specific electrical double layer capacity ($C_0$) can be calculated as indicated by the following equations 8-9:

Charging mode (FIG. 5):

$$C0=(DP\times(t_3-t_2)\times NQ_R/[\times(Ch6-Ch7)] \quad (8)$$

Diagnostic mode (FIG. 6):

$$C0=(DP\times(t_5-t_4)\times NQ_R/[\times(Ch5-Ch6)] \quad (9)$$

In one embodiment, N (the number of cells) can be obtained by dividing $E_i$ reversible OCV for every chemistry and taking the nearest integer. For example, N for Li-ion chemistry is $E_i/3.6$, N for Ni-based is $E_i/1.35$, and N for LA battery is $E_i/2$.

Figure 7:
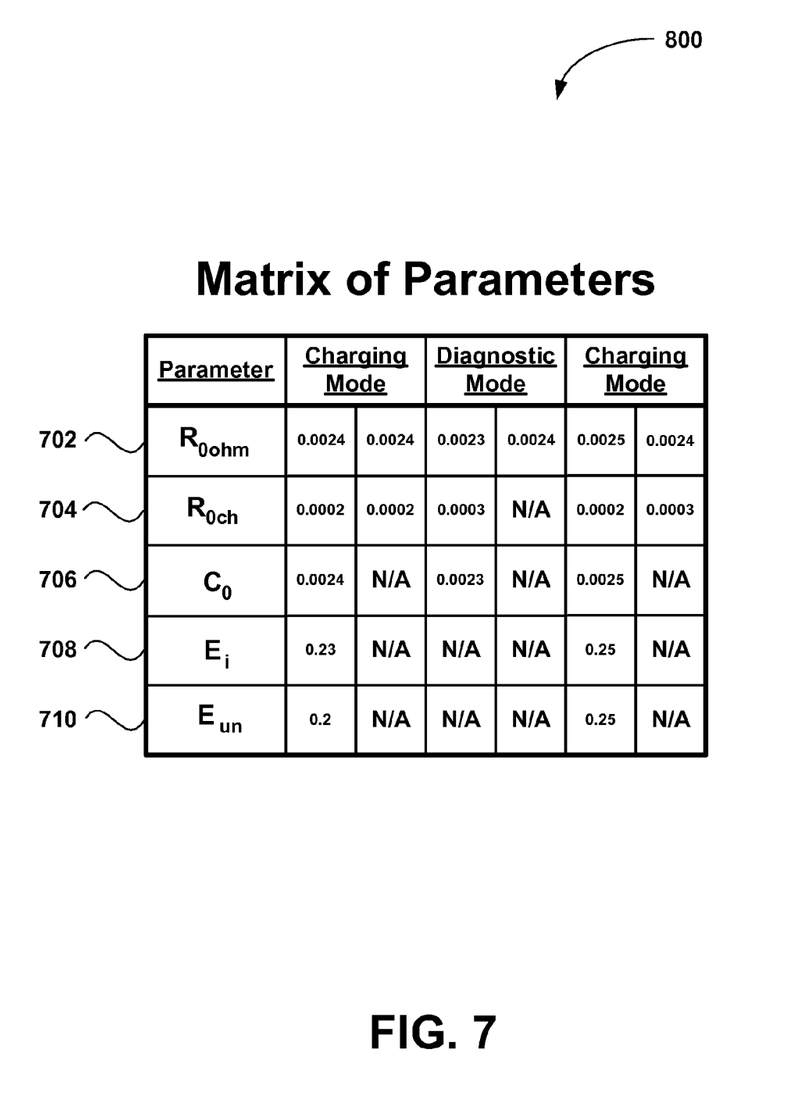
FIG. 7 is a matrix of parameters table, in accordance with an embodiment of the present invention.

FIG. 7 is a matrix of parameters table 700, in accordance with an embodiment of the present invention. The results of the above equations 1-9 form the data entries for the matrix of parameters 700. For example, row 702 includes the battery specific ohm resistance results as calculated using equations 1 and 2 during charging mode, equations 3 and 4 during diagnostic mode, and equations 1 and 2 again during an additional charging mode. The various results in row 702 allow greater accuracy in determining the battery specific ohm resistance, since the results can be compared with each other, averaged, or processed in any other manner to provide greater accuracy, as will be apparent to those skilled in the art after a careful reading of the present disclosure.

Similarly, row 704 includes the battery specific chemical resistance results as calculated using equations 5 and 6 during charging mode, equation 7 during diagnostic mode, and equations 5 and 6 again during an additional charging mode. As above, the various results in row 704 allow greater accuracy in determining the battery specific chemical resistance. Row 706 includes the battery specific double layer capacity results as calculated using equation 8 during charging mode, equation 9 during diagnostic mode, and equation 8 again during an additional charging mode. Rows 708 and 710 include the battery OCV results. In particular, row 708 includes the battery instantaneous open circuit voltage as read from channel 2 during charging mode, and row 710 includes the battery unstationary open circuit voltage as read from channel 12 during charging mode, which is sampled about 150-500 ms after current interruption.

Referring back to FIG. 3, in operation 310, the battery state of health is determined utilizing the matrix of parameter data. As mentioned previously, a battery's state of health comprises state of charge, useful remaining battery life as a function of battery life cycle, and useful remaining battery discharge time as a function of the current battery discharge rate. To determine the battery state of charge, embodiments of the present invention categorize the battery into type, and then utilize the matrix of parameter data to determine the state of charge based on the battery type, as illustrated next with reference to FIG. 8.

Figure 8:
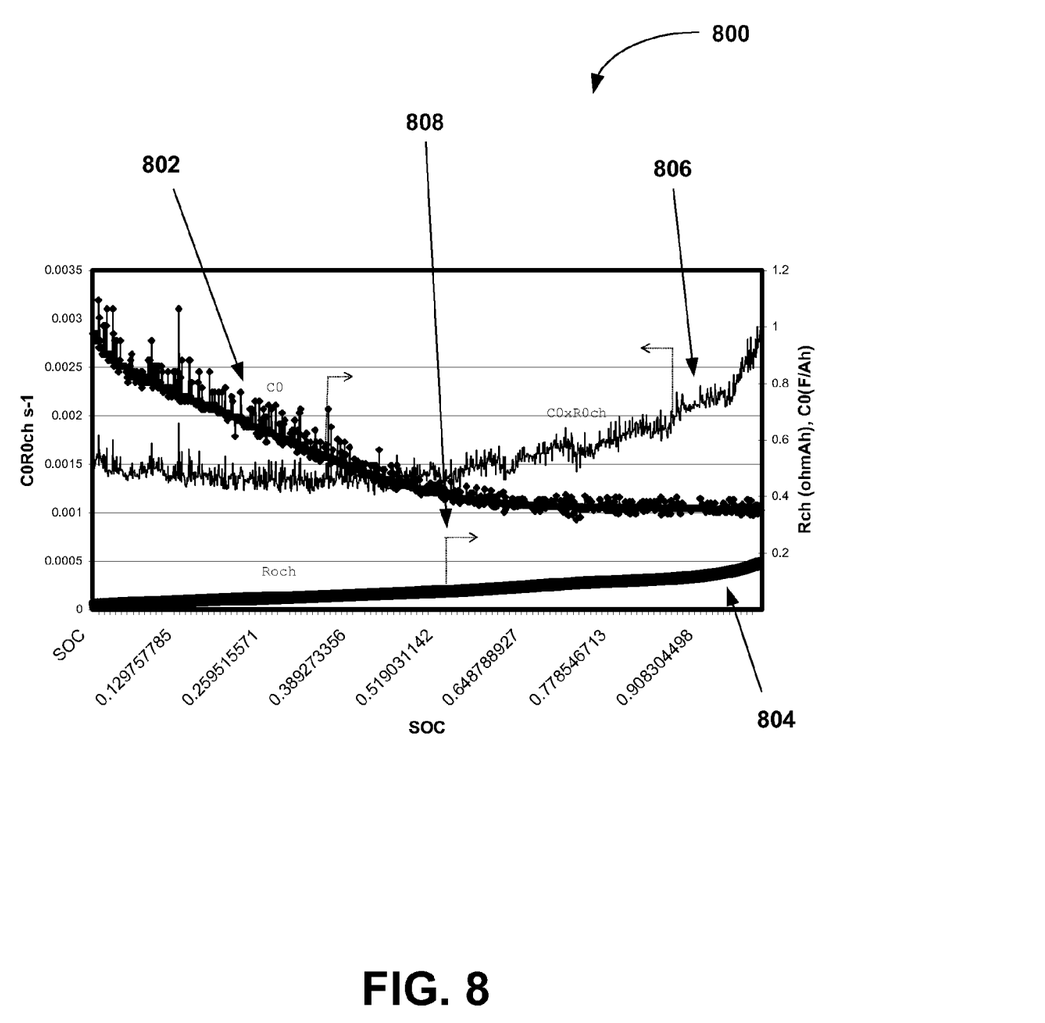
FIG. 8 is a graph showing a state of charge profile for lead acid (LA) batteries.

FIG. 8 is a graph 800 showing a state of charge profile for lead acid (LA) batteries. To determine the battery state of charge, embodiments of the present invention generate a state of charge profile for the battery that indicates matrix of parameter data values corresponding to a plurality of battery state of charge percentages, as illustrated in FIG. 8. Once the state of charge profile is generated, embodiments of the present invention can determine the actual state of charge of a battery by comparing the current matrix of parameters for the battery to the state of charge profile generated above.

For example, the graph 800 shows the electrical double layer capacity ($C_0$) 802 for a LA battery at various state of charge percentages. The graph 800 also shows the specific chemical resistance ($R_{Och}$) 804 for a LA battery at various state of charge percentages. In addition, the product ($C_0 \times R_{Och}$) 806 of $C_0$ and $R_{Och}$ at various state of charge percentages is shown in graph 800. Thus, as illustrated in FIG. 8, the state of charge for a LA battery is a function of the battery specific chemical resistance and the battery specific electrical double layer capacity. That is, since the values of $C_0$ 802, $R_{Och}$ 804, and $C_0 \times R_{Och}$ 806 are known at each level of state of charge for a LA battery, embodiments of the present invention can determine the state of charge for a particular LA battery by obtaining the current values of $C_0$ 706 and $R_{Och}$ 702 from the matrix of parameters 700, calculating $C_0 \times R_{Och}$, and comparing these values to the predetermined data shown in graph 800.

For example, the values for $C_0$ 802 and $R_{Och}$ 804 for a LA battery at each level of state of charge can be determined empirically and recorded, as illustrated in graph 800. Thereafter, when examining a LA battery, the matrix of parameter data 700 for a LA battery, which includes the $C_0$ and $R_{Och}$, can be utilized to determine the battery's state of charge. For example, a LA battery having an electrical double layer capacity $C_0$ value of 0.7 FAh could indicate a battery state of charge of about 25%.

For LA batteries the electrical double layer capacity ($C_0$) 802 of the battery can be used to determine battery state of charge for up to 70% of the battery's maximum state of charge, illustrated at point 808. Thereafter, the battery specific chemical resistance 804 and/or the product of product 806 of $C_0$ and $R_{Och}$ can be utilized to determine the battery state of charge. Although the above has been described in terms of utilizing empirical data analysis to determine the values for graph 800, the data can be determined by any means which allows predetermined knowledge of battery state of health as a function of $C_0$, $R_{Och}$, and the product 804 of $C_0$ and $R_{Och}$.

Figure 9:
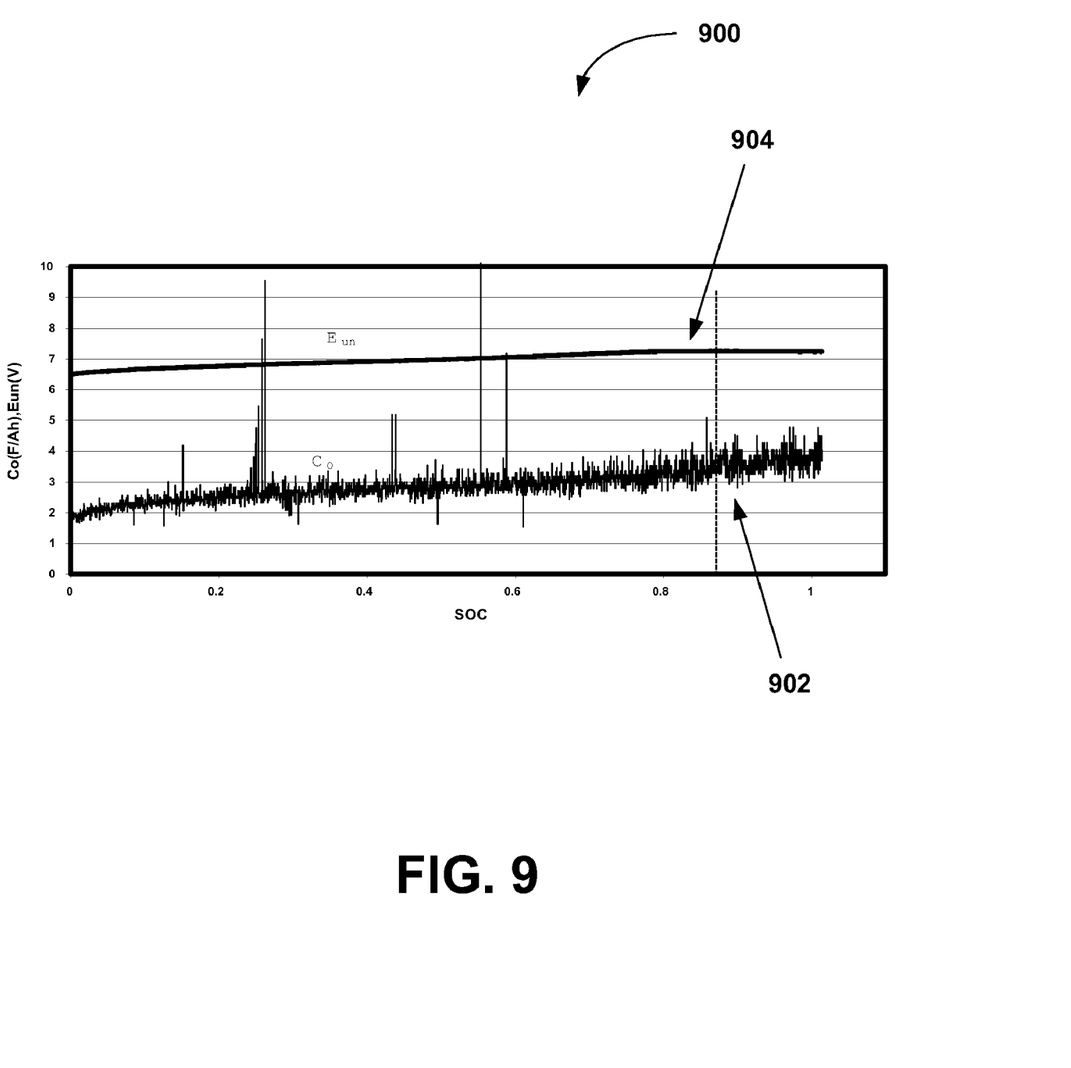
FIG. 9 is a graph showing a state of charge profile for nickel metal hydride (NiMH) batteries.

FIG. 9 is a graph 900 showing a state of charge profile for nickel metal hydride (NiMH) batteries. The graph 900 shows the electrical double layer capacity ($C_0$) 902 and the unstationary open circuit voltage ($E_{un}$) 904 for a NiMH battery at various state of charge percentages. As illustrated in FIG. 9, the state of charge for a NiMH battery is a function of the battery specific electrical double layer capacity and the battery unstationary open circuit voltage. Similar to above, embodiments of the present invention can determine the state of charge for a particular NiMH battery by obtaining the current values of $E_{un}$ 710 and $C_0$ 706 from the matrix of parameters 700 and comparing them to the predetermined data shown in graph 900.

As above, the values for $C_0$ 902 and $E_{un}$ 1004 for a NiMH battery at each level of state of charge can be determined empirically and recorded, as illustrated in graph 900. Thereafter, when examining a NiMH battery, the matrix of parameter data 700 for the NiMH battery, which includes the $C_0$ 706 and $E_{un}$ 710 can be utilized to determine the battery's state of charge. For example, a NiMH battery having an electrical double layer capacity $C_0$ value of 2 FAh and an unstationary open circuit voltage $E_{un}$ of 7 V could indicate a battery state of charge of about 50%. It should be noted that the data for graph 900 can be determined by any means which allows predetermined knowledge of battery state of health as a function of $C_0$ and $E_{un}$.

Figure 10:
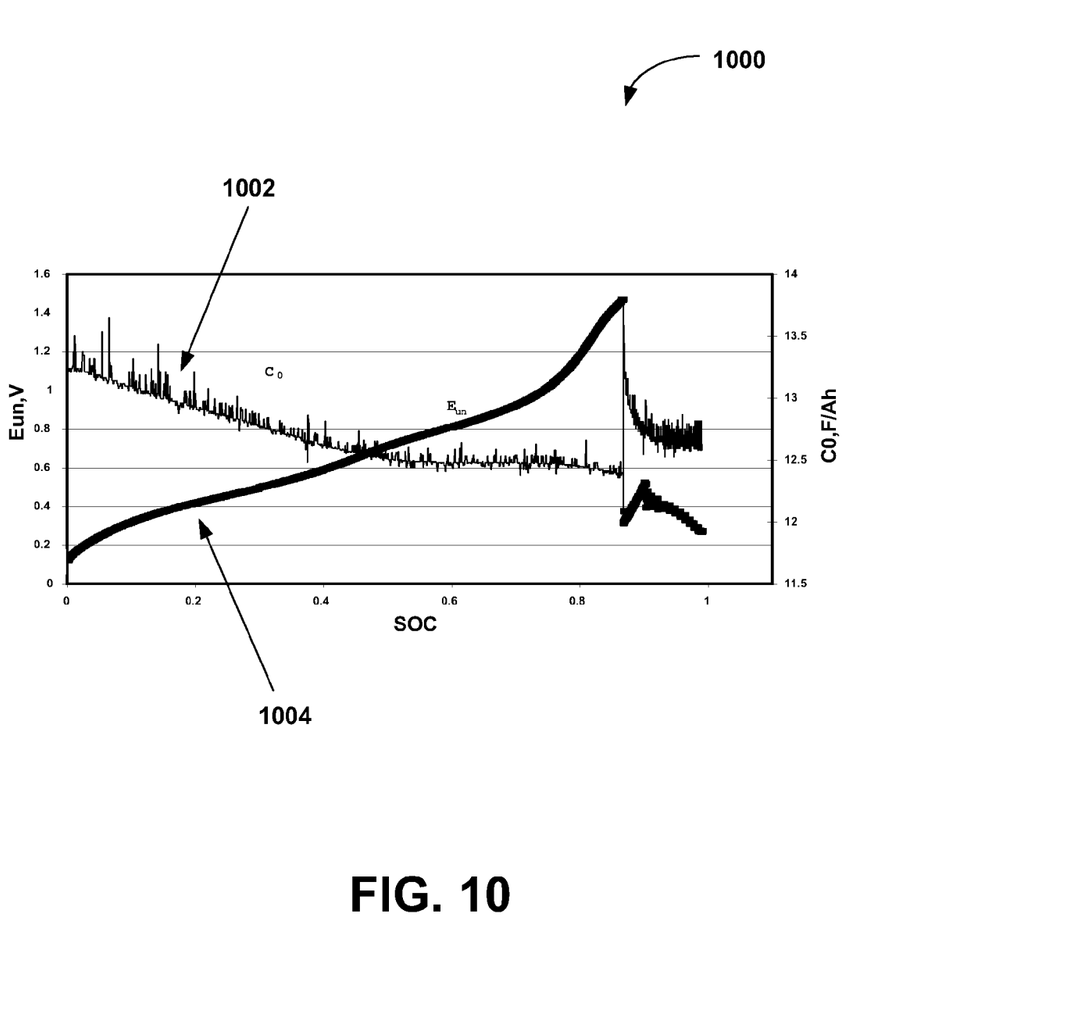
FIG. 10 is a graph showing a state of charge profile for nickel cadmium (NiCd) batteries.

FIG. 10 is a graph 1000 showing a state of charge profile for nickel cadmium (NiCd) batteries. The graph 1000 shows the electrical double layer capacity ($C_0$) 1002 and the unstationary open circuit voltage ($E_{un}$) 1004 for a NiCd battery at various state of charge percentages. Similar to NiMH batteries, the state of charge for a NiCd battery is a function of the battery specific electrical double layer capacity and the battery unstationary open circuit voltage, and as such embodiments of the present invention can determine the state of charge for a particular NiCd battery by obtaining the current values of $E_{un}$ 710 and $C_0$ 706 from the matrix of parameters 700 and comparing them to the predetermined data shown in graph 1000. As above, the values for $C_0$ 1002 and $E_{un}$ 1004 for a NiCd battery at each level of state of charge can be determined empirically and recorded, as illustrated in graph 1000. Thereafter, when examining a NiCd battery, the matrix of parameter data 700 for the NiCd battery, which includes the $C_0$ 706 and $E_{un}$ 710 can be utilized to determine the battery's state of charge.

Embodiments of the present invention can implement state of charge recognition in Lithium ion (Li-ion) batteries utilizing two approaches. In a first approach, is based on current measurement and charging pulses (CP) integration, as indicated by equation 10 below:

$$SOC(t+\Delta t) = SOC(t) + CP \int dt / 3600 Qr, \qquad (10)$$

Figure 11:
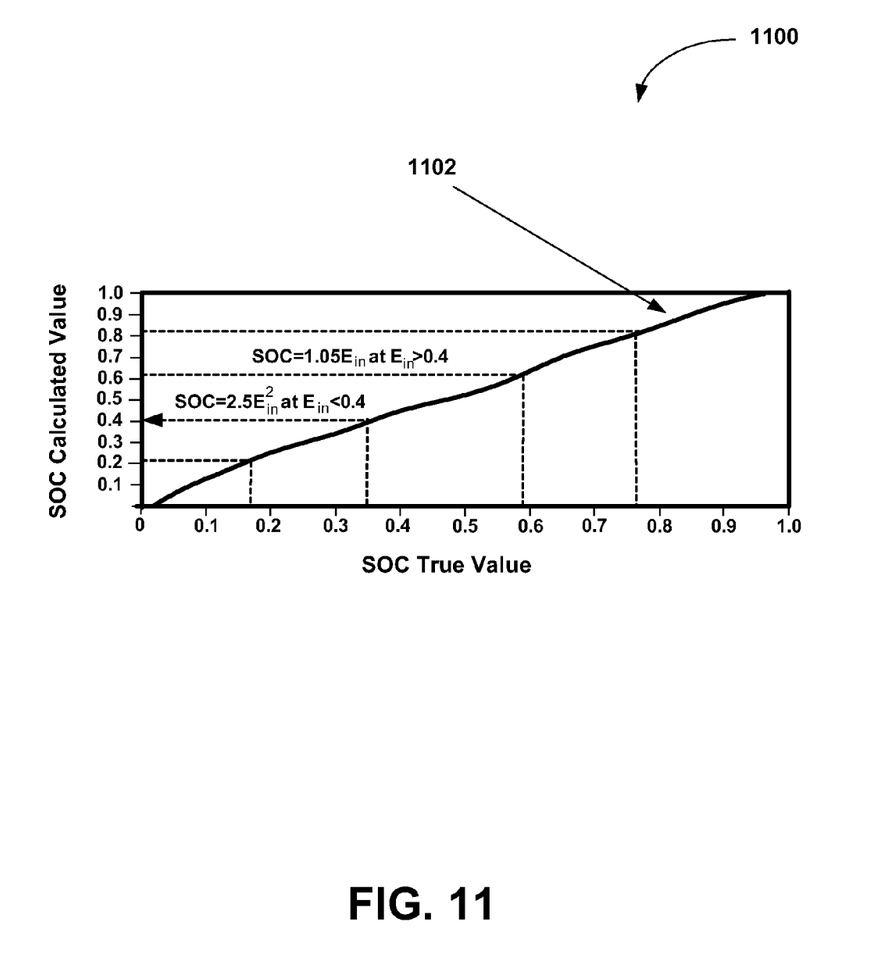
FIG. 11 is a graph showing a state of charge profile for Li-ion batteries.

In a second approach, the normalized (to one cell) instantaneous open circuit voltage ($E_{in}$) of the battery is utilized to determine the state of charge of the battery, as in FIG. 11. FIG. 11 is a graph 1100 showing a state of charge profile for Li-ion batteries. The graph 1100 shows the instantaneous open circuit voltage ($E_i$) 1102 for a Li-ion battery at various state of charge percentages. Normalization for an N cell battery is provided by following procedure: $E_{in} = (E_i - 3.7N)/0.5N$. The range of normalized $E_{in}$ is $0 \le E_{in} \le 1$. The value of $E_{in} < 0$ is considered equal 0. Embodiments of the present invention can determine the state of charge for a particular Li-ion battery by obtaining the current values of $E_i$ 708 from the matrix of parameters 700, calculating $E_{in}$ from $E_i$, and comparing $E_{in}$ to the predetermined data shown in graph 1100. As above, the values for $E_i$ 1102 for a Li-ion battery at each level of state of charge can be determined empirically and recorded, as illustrated in graph 1100. Thereafter, when examining a Li-ion battery, the matrix of parameter data 700 for the Li-ion battery, which includes the $E_i$ 708 can be utilized to determine the battery's state of charge.

In addition to state of charge, a battery's state of health includes useful remaining battery discharge time as a function of the current battery discharge rate, and useful remaining battery life as a function of battery life cycle. To calculate these state of health factors, embodiments of the present invention determine the battery's capability to provide required energy and power within the current cycle, using the matrix of parameter data. It should first be noted that inherent battery inductance is close to zero and, as such, all voltage drop across inductance resistance is associated with the external wire. In addition, the effect of inductance inside of mks time interval is much shorter than the time constant associated with the presence of electrical double layer capacity and chemical resistance. Therefore, inductance can be ignored by calculation transient terminal voltage. Thus, the equation for transient battery terminal voltage by applying peak power can is:

$$V = Er - IR_{ohm} - I(1 - e^{-t/RchC})R_{ch} \quad (11)$$

where $E_r$ is reversible OCV. $E_r$ for Li-ion battery has range 3.5-4.2V and depends on SOC. $E_r$ for LA chemistry is taken as 2V, for Ni-based chemistry $E_r$=1.35V.

Utilizing the values within the matrix of parameters 700, embodiments of the present invention can recognize battery voltage under transient and stationary power using equation (11). Initially, voltage is affected by ohm resistance and electrical double layer capacity, then in stationary condition under $t>>R_{ch}C$ the major contributor to voltage loss is summary ohm and chemical polarization. Thus, in stationary conditions equation (11) transfers into equation:

$$V = Er - I(R_{ohm} + R_{ch}) \quad (12)$$

Equation (12) assumes that $R_{ch}$ is constant. As a rule ohm resistance depends on current and equation (12) can be rewritten as:

$$V = Er - IR_{ohm} - IR_{ch}(I) \quad (13)$$

Dependence $R_{ch}$ from current can be obtained in diagnostic mode by applying a series of different currents and sampling ohm chemical resistance corresponding to the current, as described above.

Utilizing the voltage information obtain above, embodiments of the present invention can determine the useful battery discharge time as a function of the current battery discharge rate. Embodiments of the present invention predict the battery operation time by given discharging current using the following equation:

$$T = Q/I_{ds} \text{ at } V = E_r - I(R_{ohm} + R_{ch}) > V_{min} \quad (14)$$

where $V_{min}$ is the minimum allowable battery voltage, Q is the current SOC expressed in Ah, and $I_{ds}$ is the maximum discharging current. For conversion dimensionless SOC value in SOC with Ah dimension, dimensionless SOC can be multiplied by battery rated capacity. $R_{ohm}$ and $R_{ch}$ data is obtained from the matrix of parameter data 700. The peak power within milliseconds time interval can be calculated based on knowing electrical double layer capacity value. Voltage drop during peak current $I_{max}$ for time period equal $t_p$ is recognized based on the following equation:

$$V = E_r - I_{max} \times P \times t_p / C_0 \quad (15)$$

Cold Cranking Amperes (CCA) for SLI lead acid batteries can be calculated by knowing minimum voltage (1.0V/cell), dependence $R_{ohm}$ and $R_{ch}$ from temperature (at −17.8° C.), required discharging current (hundreds amp.), discharging time (30 s) and using equation (13).

Figure 12A:
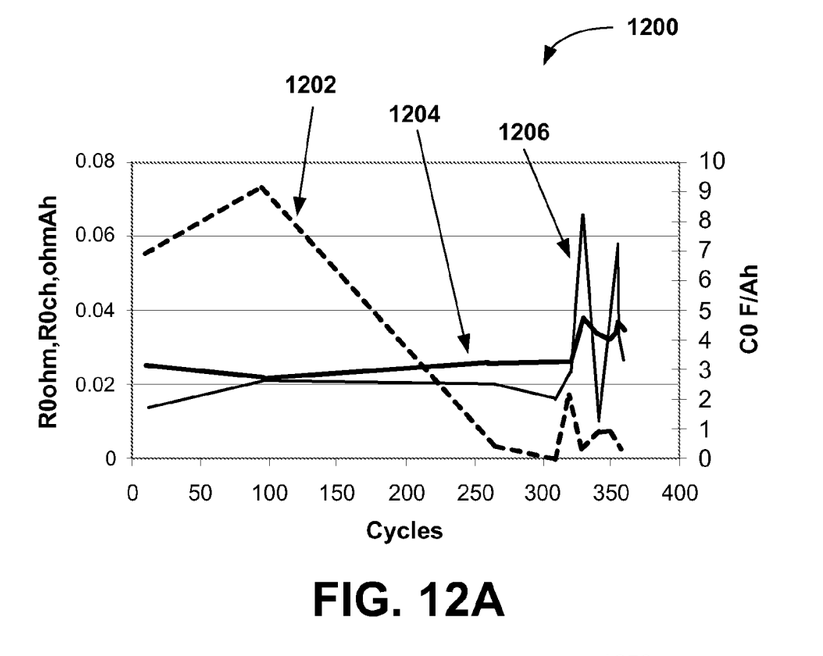
FIG. 12A is a graph showing the change in battery specific electrical double layer capacity, battery specific ohm resistance, and battery specific chemical resistance as a function of the cycle when the battery state of charge is about 0%.
Figure 12B:
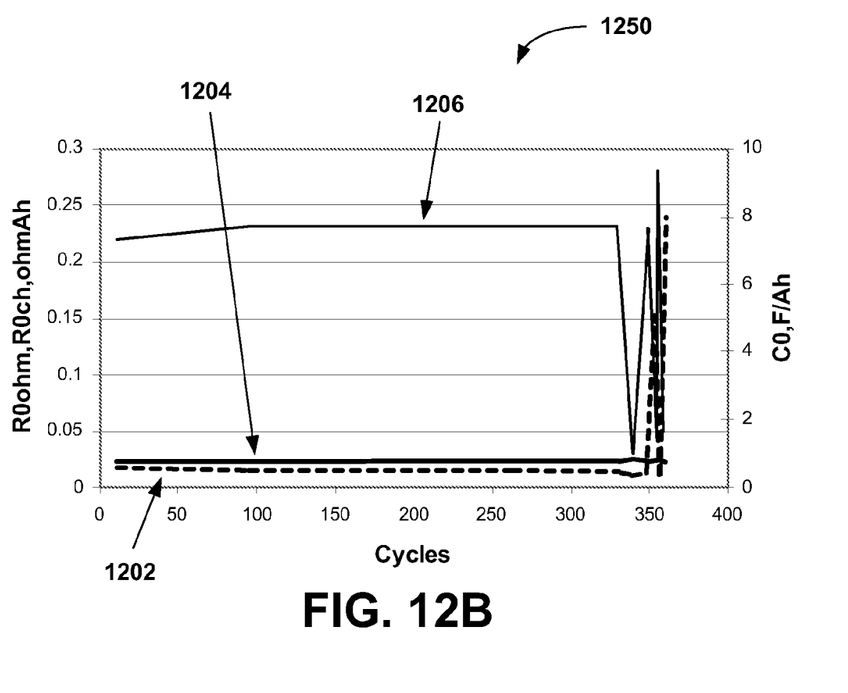
FIG. 12B is a graph showing the change in battery specific electrical double layer capacity, battery specific ohm resistance, and battery specific chemical resistance as a function of the cycle when the battery state of charge is about 100%.

Embodiments of the present invention determine useful remaining life as a function of life cycle by monitoring the matrix of parameters data transformation vs. cycle life, as illustrated in FIGS. 12A and 12B. FIG. 12A is a graph 1200 showing the change in battery specific electrical double layer capacity 1202, battery specific ohm resistance 1204, and battery specific chemical resistance 1206 as a function of the cycle when the battery state of charge is about 0%. As can be seen in graph 1200, the battery specific ohm resistance and the battery specific chemical resistance rise abruptly about twenty cycles prior to failure for the discharging battery.

FIG. 12B is a graph 1250 showing the change in battery specific electrical double layer capacity 1202, battery specific ohm resistance 1204, and battery specific chemical resistance 1206 as a function of the cycle when the battery state of charge is about 100%. FIG. 12B illustrates the tendency of the electrical double layer capacity to rise abruptly about ten cycles prior to failure for the fully charged battery. Thus, by examining the changes in the matrix of parameters, embodiments of the present invention can predict battery failure before failure actually occurs. For example, when examining the state of health for a discharged battery, the battery specific ohm resistance and the battery specific chemical resistance rise abruptly, embodiments of the present invention can warn a user that failure is imminent. That is, the battery will only be able to be recharged about 20 more times.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A method for determining a state of health of a battery, comprising the operations of:
    applying a predefined load profile to a battery;
    obtaining a plurality of battery response voltage data corresponding to points along the predefined load profile;
    calculating a matrix of parameters from the battery response voltage data, wherein the matrix of parameters includes battery ohm resistance data, battery chemical resistance data, and battery electrical double layer capacity data;
    determining from the matrix of parameters the state of health of the battery; and
    determining useful remaining life of the battery, wherein an end to the useful remaining life of the battery is predicted when a sharp rise occurs in the battery electrical double layer capacity when a battery state of charge is about 100%.

2. A method as recited in claim 1, wherein the state of health of the battery includes state of charge of the battery, battery useful remaining life as a function of life cycle, and battery useful remaining discharge time as a function of current discharge rate.

3. A method as recited in claim 2, where the matrix of parameters further includes battery voltage, battery current, and battery instantaneous open circuit voltage.

4. A method as recited in claim 1, further comprising the operation of:
generating the state of charge profile for the battery, wherein the state of charge profile indicates matrix of parameter data values corresponding to at least two battery state of charge percentages; and
comparing the matrix of parameters to the state of charge profile to determine the current battery state of charge.

5. A method as recited in claim 4, further comprising the operation of determining useful remaining discharge time as a function of current discharge rate utilizing the current battery state of charge and matrix of parameters.

6. A method as recited in claim 4, further comprising the operation of determining the useful remaining life of the battery as a function of life cycle utilizing the matrix of parameters.

7. A method as recited in claim 6, wherein an end to the useful remaining life of the battery is predicted when a sharp rise occurs in the battery chemical resistance when the battery state of charge is about 0%.

8. A method for determining a state of health of a battery, comprising the operations of:
generating a state of charge profile for a battery, wherein the state of charge profile indicates matrix of parameter data values corresponding to at least two battery state of charge percentages;
calculating a current matrix of parameters for the battery from current battery response voltage data, wherein the current matrix of parameters includes battery ohm resistance data, battery chemical resistance data, and battery electrical double layer capacity data;
comparing the current matrix of parameters to the state of charge profile to determine the current battery state of charge;
determining the state of health of the battery based on the current battery state of charge; and
determining useful remaining life of the battery, wherein an end to the useful remaining life of the battery is predicted when a sharp rise occurs in the battery electrical double layer capacity when a battery state of charge is about 100%.

9. A method as recited in claim 8, wherein the state of health further includes battery useful remaining life as a function of life cycle, and battery useful remaining discharge time as a function of current discharge rate.

10. A method as recited in claim 9, further comprising the operation of determining useful remaining discharge time as a function of current discharge rate utilizing the current battery state of charge.

11. A method as recited in claim 9, further comprising the operation of determining the useful remaining life of the battery as a function of life cycle utilizing the current matrix of parameters.

12. A method as recited in claim 11, wherein an end to the useful remaining life of the battery is predicted when a sham rise occurs in the battery chemical resistance when the battery state of charge is about 0%.

13. A system for determining a state of health of a battery, comprising:
a switching circuit coupled to a power source and a battery load, the switching circuit capable of applying a predefined load profile to a battery; and
a battery management module coupled to the switching circuit, the battery management module comprising:
logic that obtains a plurality of battery response voltage data corresponding to points along the predefined load profile;
logic that calculates a matrix of parameters from the battery response voltage data, wherein the matrix of parameters includes battery ohm resistance data, battery chemical resistance data, and battery electrical double layer capacity data; and
logic that determines from the matrix of parameters the state of health of the battery; and
logic that predicts an end to the useful remaining life of the battery when a sharp rise occurs in the battery electrical double layer capacity when the battery state of charge is about 100%.

14. A system as recited in claim 13, wherein the battery management module further comprises:
logic that generates a state of charge profile for the battery, wherein the state of charge profile indicates matrix of parameter data values corresponding to at least two battery state of charge percentages; and
logic that compares the matrix of parameters to the state of charge profile to determine the current battery state of charge.

15. A system as recited in claim 14, wherein the battery management module further comprises logic that determines useful remaining discharge time as a function of current discharge rate utilizing the current battery state of charge.

16. A system as recited in claim 14, wherein the battery management module further comprises logic that determines useful remaining life of the battery as a function of life cycle utilizing the matrix of parameters.

17. A system as recited in claim 16, wherein the battery management module predicts an end to the useful remaining life of the battery when a sharp rise occurs in the battery chemical resistance when the battery state of charge is about 0%.

* * * * *